(12) United States Patent
Sun et al.

(10) Patent No.: US 12,237,429 B2
(45) Date of Patent: Feb. 25, 2025

(54) SOLAR CELL AND MANUFACTURING METHOD THEREOF

(71) Applicant: SUZHOU INSTITUTE OF NANO-TECH AND NANO-BIONICS (SINANO), CHINESE ACADEMY OF SCIENCES, Suzhou (CN)

(72) Inventors: Qiangjian Sun, Suzhou (CN); Shulong Lu, Suzhou (CN); Junhua Long, Suzhou (CN); Xuefei Li, Suzhou (CN); Pan Dai, Suzhou (CN)

(73) Assignee: SUZHOU INSTITUTE OF NANO-TECH AND NANO-BIONICS (SINANO), CHINESE ACADEMY OF SCIENCES, Jiangsu (CN)

( * ) Notice: Subject to any disclaimer, the term of this patent is extended or adjusted under 35 U.S.C. 154(b) by 119 days.

(21) Appl. No.: 18/011,654

(22) PCT Filed: Jun. 9, 2021

(86) PCT No.: PCT/CN2021/099062
§ 371 (c)(1),
(2) Date: Dec. 20, 2022

(87) PCT Pub. No.: WO2022/052534
PCT Pub. Date: Mar. 17, 2022

(65) Prior Publication Data
US 2023/0335654 A1 Oct. 19, 2023

(30) Foreign Application Priority Data
Sep. 8, 2020 (CN) .......................... 202010933895.X

(51) Int. Cl.
*H01L 31/18* (2006.01)
*H01L 31/0216* (2014.01)
*H01L 31/0224* (2006.01)

(52) U.S. Cl.
CPC ............... *H01L 31/022433* (2013.01); *H01L 31/02168* (2013.01); *H01L 31/1864* (2013.01); *H01L 31/184* (2013.01)

(58) Field of Classification Search
CPC ......... H01L 31/18; H01L 31/184–1856; H01L 31/022425; H01L 31/022441; H01L 31/02167; H01L 31/02008
See application file for complete search history.

(56) References Cited

U.S. PATENT DOCUMENTS

| 5,595,607 | A | * | 1/1997 | Wenham | ............... | H01L 31/046 |
| | | | | | | 257/E27.125 |
| 2005/0016584 | A1 | * | 1/2005 | Kukulka | ......... | H01L 31/022425 |
| | | | | | | 438/57 |

(Continued)

FOREIGN PATENT DOCUMENTS

| CN | 101562207 A | | 10/2009 | | |
| CN | 103489499 A | * | 1/2014 | ............... | H01B 1/16 |

(Continued)

OTHER PUBLICATIONS

English machine translation of Yang et al. (KR 2010-0098043) published Sep. 2010.*

(Continued)

*Primary Examiner* — Christina Chern
(74) *Attorney, Agent, or Firm* — The Dobrusin Law Firm, P.C.

(57) ABSTRACT

The present invention discloses a manufacturing method of a solar cell, including: forming an electricity generation layer on a substrate; forming an ohmic contact layer on a surface of the electricity generation layer facing away from the substrate; forming a back electrode on a surface of the substrate facing away from the electricity generation layer; and forming a top electrode on a surface of the ohmic contact layer facing away from the electricity generation (Continued)

layer using a printing process. The present invention discloses a solar cell. The present invention solves the problem of low capacity of the solar cell at present.

8 Claims, 4 Drawing Sheets

(56) References Cited

U.S. PATENT DOCUMENTS

| | | | | |
|---|---|---|---|---|
| 2015/0162477 A1* | 6/2015 | Hirose | ............... | H01L 31/077 136/261 |
| 2016/0054479 A1* | 2/2016 | Ho | ............... | G02B 1/18 359/601 |
| 2018/0301576 A1 | 10/2018 | Park et al. | | |

FOREIGN PATENT DOCUMENTS

| | | | | |
|---|---|---|---|---|
| CN | 103618030 | A | | 3/2014 |
| CN | 103985782 | A | | 8/2014 |
| CN | 104362216 | A | | 2/2015 |
| CN | 204315591 | U | | 5/2015 |
| CN | 112054094 | A | | 12/2020 |
| KR | 20090123554 | A | | 12/2009 |
| KR | 20100098043 | A | * | 9/2010 ........... H01L 31/042 |

OTHER PUBLICATIONS

English machine translation of Liu et al. (CN 103489499) published Jan. 2014.*
International Search Report dated Aug. 30, 2021, Application No. PCT/CN2021/099062.

* cited by examiner

SOLAR CELL AND MANUFACTURING METHOD THEREOF

TECHNICAL FIELD

The present invention relates to the technical field of photovoltaic devices, and more particularly to a solar cell and a manufacturing method thereof.

BACKGROUND ART

Solar cells are semiconductor devices that use sunlight to directly generate electricity. In order to receive sunlight, electrodes disposed on a light-receiving surface of the solar cell are in a form of grids. Sunlight is incident on the light-receiving surface of the solar cell through a gap of a top electrode, and is then converted to electric energy under photovoltaic effect of the solar cell.

Currently, an electron beam evaporation process or a magnetron sputtering process is typically adopted to form the top electrode of the solar cell. Before using the electron beam evaporation process or the magnetron sputtering process to evaporate metal materials, a process of forming a grid mask by a photoresist exposure development process is included. After evaporating metal materials, a process of dissolving the photoresist mask using a special corrosive liquid. After dissolving the photoresist mask, a cleaning process is included to facilitate removing the metal materials formed on the photoresist mask to obtain a complete top electrode.

As mentioned above, since the top electrode of the solar cell is formed using the electron beam evaporation process or the magnetron sputtering process, both of which are excessively complicated and limit the capacity of the solar cell, thereby resulting in that the solar cell can be used only in defined fields.

SUMMARY OF THE INVENTION

In view of the deficiencies in the prior art, the present invention provides a technical solution as follows.

According to an aspect of the present invention, provided is a manufacturing method of a solar cell, the method includes:
  forming an electricity generation layer on a substrate;
  forming an ohmic contact layer on a surface of the electricity generation layer facing away from the substrate;
  forming a back electrode on a surface of the substrate facing away from the electricity generation layer; and
  forming a top electrode on a surface of the ohmic contact layer facing away from the electricity generation layer using a printing process.

Optionally, the method of forming the top electrode specifically includes:
  disposing a screen printing plate on the ohmic contact layer;
  printing a nano silver paste layer at a printing speed of 130 mm/s to 160 mm/s; and
  performing annealing and curing on the nano silver paste layer to form the top electrode,
  in which the number of printed mesh counts of the screen printing plate is from 300 mesh to 500 mesh.

Optionally, the method of forming the back electrode specifically includes:
  sequentially stacking a Ti layer, a Pt layer, and an Au layer on the surface of the substrate facing away from the electricity generation layer; and
  performing annealing on the stacked Ti layer, Pt layer, and Au layer in an Ar gas environment to form the back electrode.

Optionally, after forming the top electrode, the manufacturing method further includes:
  etching the ohmic contact layer with the top electrode as a mask to expose a partial region of the electricity generation layer; and
  forming an anti-reflection film over the partial region.

Optionally, the method of forming the anti-reflection film specifically includes: sequentially stacking and forming a $Ti_3O_5$ layer and a $SiO_2$ layer on the partial region.

Optionally, the method of forming the electricity generation layer on the substrate includes:
  forming a back-surface field layer on the substrate;
  forming a photovoltaic layer on the back-surface field layer; and
  forming a window layer on the photovoltaic layer.

Optionally, the substrate is made of an InP material.

Optionally, the electricity generation layer and the ohmic contact layer are made of a Group III-V semiconductor material.

Optionally, before forming the ohmic contact layer, the method further includes: before forming the top electrode, the manufacturing method further includes: cleaning the surface of the ohmic contact layer using a cleaning liquid.

According to another aspect of the present invention, provided is a solar cell made by the manufacturing method as described above.

When the solar cell is manufactured using the manufacturing method of the solar cell provided by the present invention, since the manufacturing process of the top electrode includes only printing and curing processes, the manufacturing process of the top electrode is effectively simplified, thereby improving the capacity of the solar cell.

DETAILED DESCRIPTION

Figure 1:
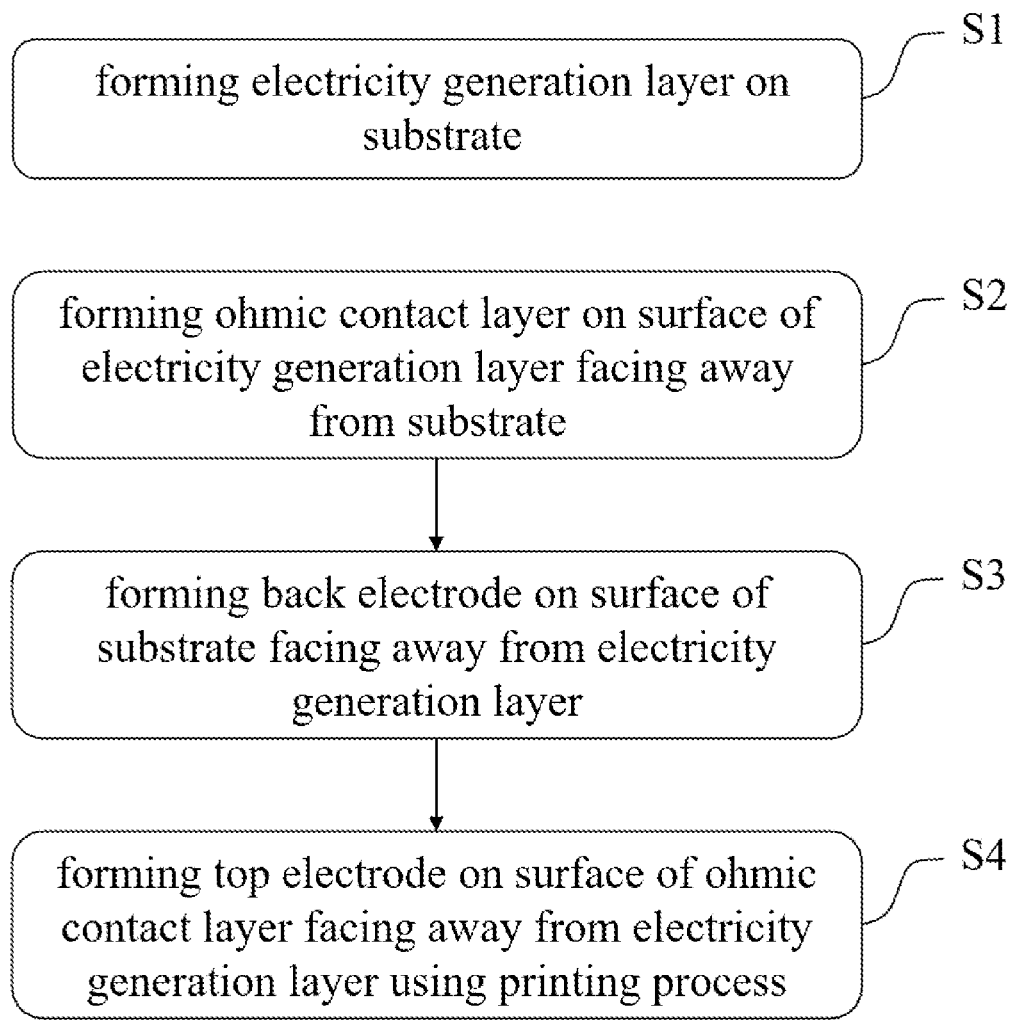
FIG. 1 is a flow diagram of a manufacturing method of a solar cell according to an embodiment of the present invention.

In order to provide a clearer understanding of the objective, technical solutions and advantages of the present invention, embodiments of the present invention will be further described in detail in conjunction with the accompanying drawings. Examples of these preferred embodiments are illustrated in the accompanying drawings. The embodiments of the present invention illustrated in the accompanying drawings and described in the drawings are exemplary only, and the present invention is not limited to these embodiments. It is further noted here that, in order to avoid obscuring the present invention with unnecessary details, only structural and/or processing steps that are closely associated with the present invention are shown in the drawings while omitting other details that are not closely associated with the present invention.

Further, it will be understood that when an element such as layer, film, region, or substrate is referred to as being "on" another element or a surface of another element, the element can be directly on the other element or the surface of the other element, or an intermediate element may also be present. Optionally, when an element is referred to as being "directly on" another element or a surface of another element, no intermediate element is present.

As described in the background art, an electron beam evaporation process or a magnetron sputtering process is typically adopted to form the top electrode of the solar cell at present. However, since both of the processes described above are excessively complicated and limit the capacity of the solar cell, thereby resulting in that the solar cell can be used only in defined fields.

In order to overcome the above problems in the prior art, a manufacturing method of a solar cell capable of reducing manufacturing steps of a top electrode is provided in accordance with embodiments of the present invention, thereby simplifying the manufacturing process of the solar cell and improving capacity of the solar cell.

The manufacturing method of a solar cell according to the embodiments of the present invention will be described in detail below in conjunction with the drawings.

First Embodiment

Figure 2A:
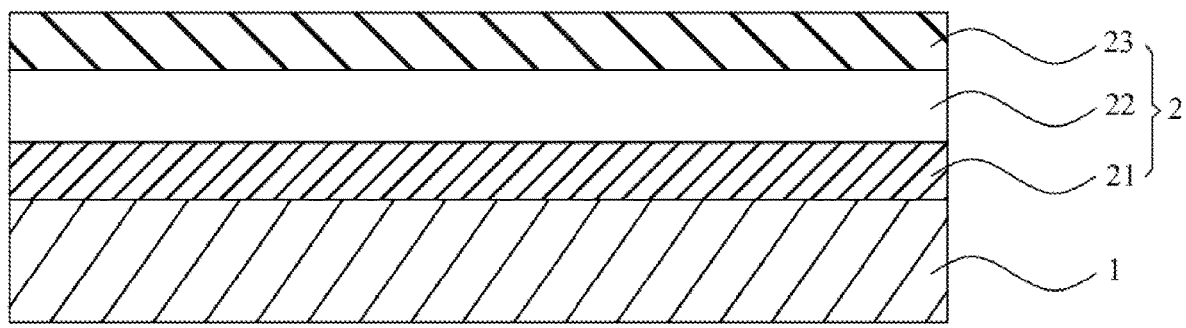
FIGS. 2a to 2d illustrate processes of manufacturing the solar cell according to embodiments of the present invention.
Figure 2B:
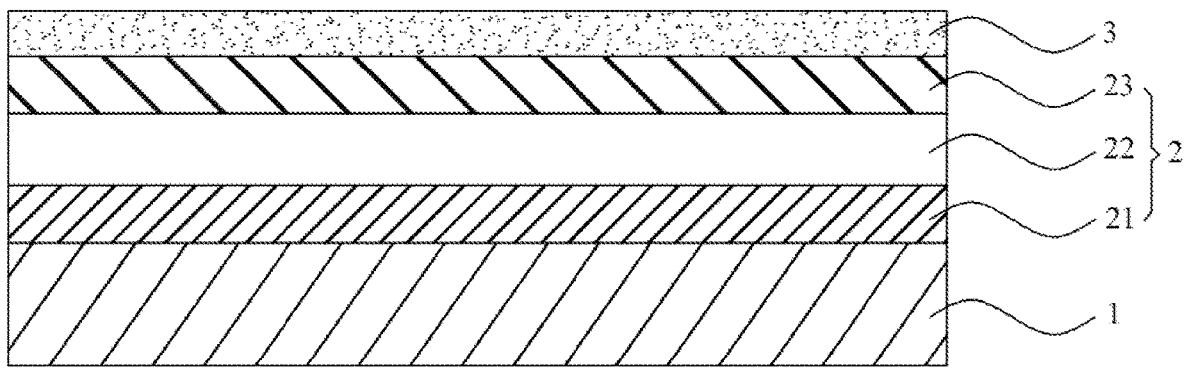
Figure 2C:
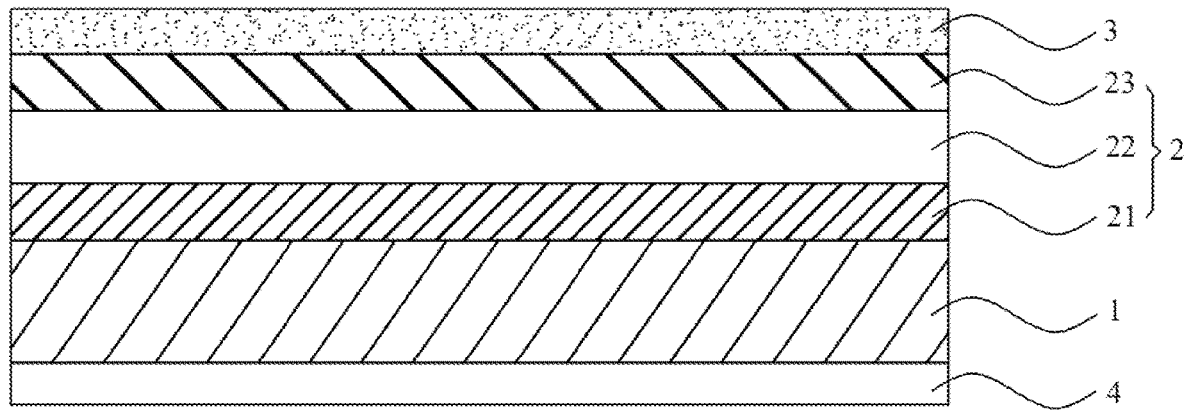
Figure 2D:
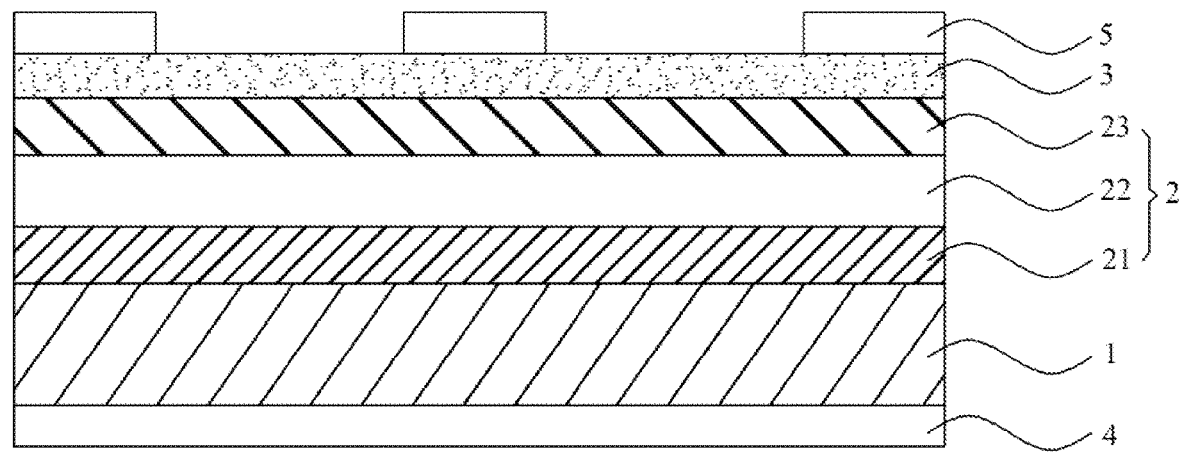

As shown in FIGS. 1 to 2d, the present embodiment provides a manufacturing method of a solar cell; the method includes the following steps.

Step S1, forming an electricity generation layer 2 on a substrate 1. Specifically, a back-surface field layer 21, a photovoltaic layer 22, and a window layer 23 are sequentially formed on the substrate 1. After connection of the back-surface field layer 21 and the photovoltaic layer 22, a higher barrier is formed, which acts as reflection for a few carriers flowing to the back-surface field layer 21 and may also reduce a surface state of the photovoltaic layer 22, lower a recombination rate of photon-generated carriers, and increase collection efficiency of the photon-generated carriers; the photovoltaic layer 22 can generate photon-generated carriers in an environment with sunlight exposure; the window layer 23 is the same as the back-surface field layer 21, and is connected with the photovoltaic layer 22 to form a higher barrier, which acts as reflection for a few carriers flowing to the window layer 23 to reduce the recombination rate of the photon-generated carriers and improve the collection efficiency of the photon-generated carriers. Preferably, the electricity generation layer 2 is made of a Group III-V semiconductor material.

Step S2, forming an ohmic contact layer 3 on a surface of the electricity generation layer 2 facing away from the substrate 1. The ohmic contact layer 3 is used to form ohmic contact with a metal material, which can reduce electrical energy loss caused by series resistance. Preferably, the ohmic contact layer 3 is made of a Group III-V semiconductor material.

Step S3, forming a back electrode 4 on a surface of the substrate 1 facing away from the electricity generation layer 2. Specifically, a Ti layer, a Pt layer, and an Au layer are sequentially stacked on the surface of the substrate 1 facing away from the electricity generation layer 2. Then, annealing is performed on the stacked Ti layer, Pt layer, and Au layer in an Ar gas environment to form the back electrode.

Step S4, forming a top electrode 5 on a surface of the ohmic contact layer 3 facing away from the electricity generation layer 2 using a printing process. Specifically, a screen printing plate is disposed on the ohmic contact layer 3, and then a nano silver paste layer is printed at a printing speed of 130 mm/s to 160 mm/s. Annealing and curing are performed on the nano silver paste layer to form the top electrode 5, in which the number of printed mesh counts of the screen printing plate is from 300 mesh to 500 mesh.

As mentioned above, when the solar cell is manufactured using the manufacturing method of the solar cell provided by the present embodiment, since the manufacturing process of the top electrode 5 includes only printing and curing processes, the manufacturing process of the top electrode 5 is effectively simplified, thereby improving the capacity of the solar cell.

Specifically, in the present embodiment, the top electrode 5 is a grid electrode including a plurality of metal strips arranged in parallel, in which a connecting portion is provided between two adjacent metal strips. The connecting portion between two adjacent metal strips is used to achieve conductive connection thereof. As another example, the top electrode 5 may also be a grid electrode.

Preferably, in the present embodiment, the substrate 1 is made of an InP material in order to guarantee epitaxial growth of the electricity generation layer 2.

Preferably, before the top electrode 5 is formed for good ohmic contact between the top electrode 5 and the ohmic contact layer 3, the manufacturing method further includes a step of cleaning the surface of the ohmic contact layer 3 using a cleaning liquid. The cleaning liquid is an acidic solution for cleaning an oxide film formed on the surface of the ohmic contact layer 3, thereby opening dangling bonds on the surface of the ohmic contact layer 3 to improve ohmic contact between the top electrode 5 and the ohmic contact layer 3.

Second Embodiment

Figure 3A:
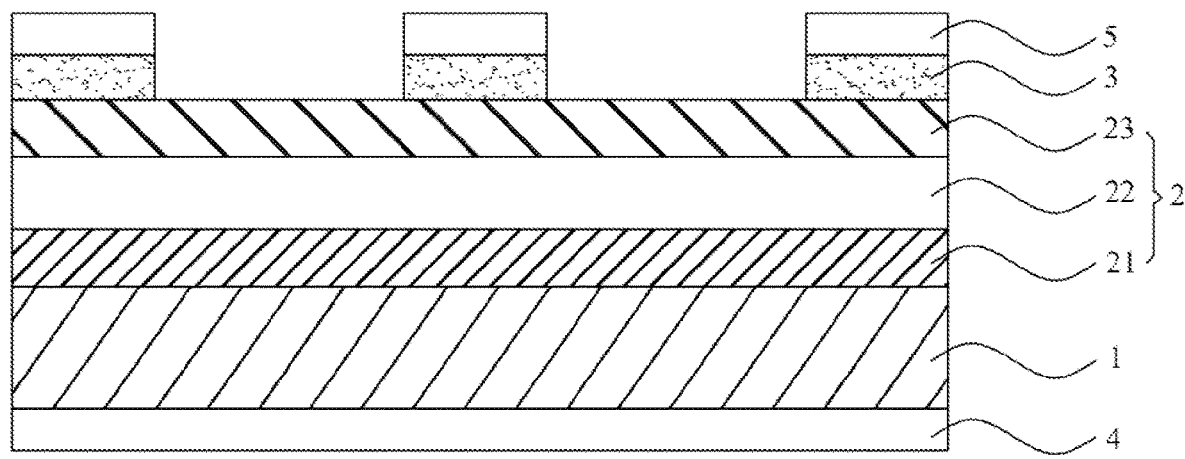
FIGS. 3a and 3b illustrate processes of manufacturing the solar cell according to other embodiments of the present invention.
Figure 3B:
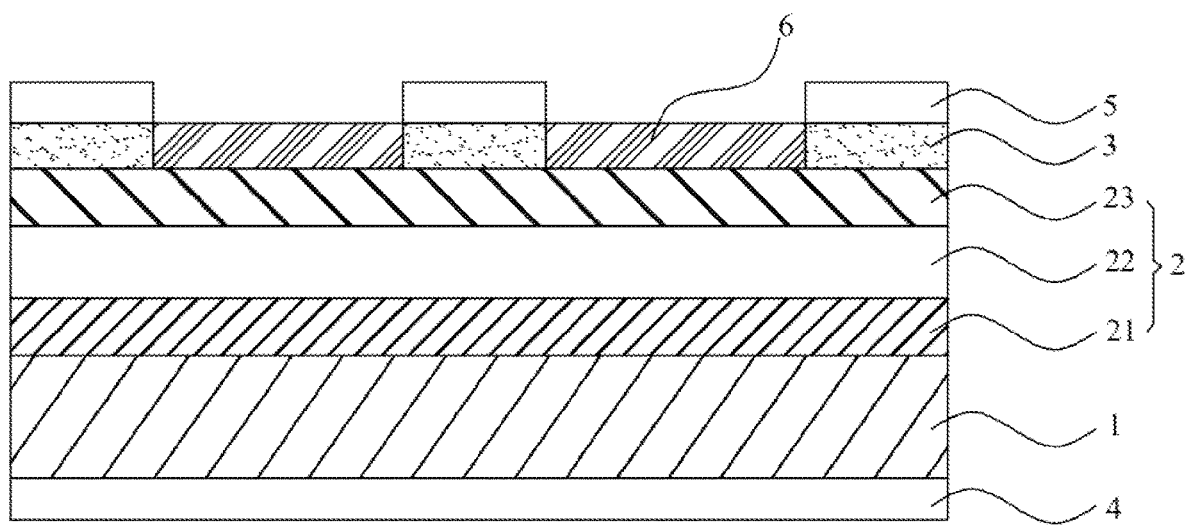

Different from the first embodiment, in order to improve photovoltaic efficiency of the solar cell, the manufacturing method in the present embodiment further includes a step of forming an anti-reflection film 6. Specifically, as shown in FIGS. 3a and 3b, the step includes:
step S5, etching the ohmic contact layer 3 with the top electrode 5 as a mask to expose a partial region of the electricity generation layer 2; and
step S6, forming the anti-reflection film 6 over the partial region. Specifically, the anti-reflection film 6 includes sequentially stacking and forming a $Ti_3O_5$ layer and a $SiO_2$ layer on the partial region.

Third Embodiment

As shown in FIG. 2d or 3b, the present embodiment provides a solar cell, which is made by the manufacturing method described in the first embodiment or the second embodiment.

It should be noted that relational terms, such as first and second and the like, are used herein only to distinguish one entity or operation from another entity or operation without necessarily requiring or implying any such actual relationship or order between such entities or operations. Moreover, terms "comprise/comprising", "contain/containing" or any other variants thereof are non-exclusive, so that a process, method, article or device including a series of elements contains not only these elements, but also other elements not listed clearly, or further contains inherent elements of the process, method, article or device. An element preceded by "comprises" does not, without more constraints, preclude the existence of additional identical elements in the process, method, article, or apparatus that comprises the element.

Although embodiments of the present invention have been illustrated and described, it should be understood that various changes, substitutions, variations, alterations, and modifications can be made to these embodiments by those skilled in the art without departing from the principle and spirit of the present invention, and the present invention is defined by the appended claims and equivalents thereof

The invention claimed is:

1. A manufacturing method of a solar cell, comprising:
   forming an electricity generation layer on a substrate, including:
   forming a back-surface field layer on the substrate,
   forming a photovoltaic layer on the back-surface field layer, and
   forming a window layer on the photovoltaic layer;
   forming an ohmic contact layer on a surface of the electricity generation layer facing away from the substrate;
   forming a back electrode on a surface of the substrate facing away from the electricity generation layer;
   forming a top electrode on a surface of the ohmic contact layer facing away from the electricity generation layer using a printing process;
   etching the ohmic contact layer with the top electrode as a mask to expose a partial region of the electricity generation layer;
   forming an anti-reflection film over the partial region by sequentially stacking and forming $Ti_2O_3$ layer and a $SiO_2$ layer on the partial region; and
   wherein the substrate is made of an InP material.

2. The manufacturing method according to claim 1, wherein the method of forming the top electrode specifically includes:
   disposing a screen printing plate on the ohmic contact layer;
   printing a nano silver paste layer at a printing speed of 130 mm/s to 160 mm/s; and
   performing annealing and curing on the nano silver paste layer to form the top electrode,
   wherein the number of printed mesh counts of the screen printing plate is from 300 mesh to 500 mesh.

3. The manufacturing method according to claim 2, wherein the method of forming the back electrode specifically includes:
   sequentially stacking a Ti layer, a Pt layer, and an Au layer on the surface of the substrate facing away from the electricity generation layer; and
   performing annealing on the stacked Ti layer, Pt layer, and Au layer in an Ar gas environment to form the back electrode.

4. The manufacturing method according to claim 1, wherein the electricity generation layer and the ohmic contact layer are made of a Group III-V semiconductor material.

5. The manufacturing method according to claim 2, wherein the electricity generation layer and the ohmic contact layer are made of a Group III-V semiconductor material.

6. The manufacturing method according to claim 3, wherein the electricity generation layer and the ohmic contact layer are made of a Group III-V semiconductor material.

7. The manufacturing method according to claim 1, wherein, before forming the top electrode, the manufacturing method further includes: cleaning the surface of the ohmic contact layer using a cleaning liquid.

8. A solar cell, wherein the solar cell is made by the manufacturing method according to claim 1.

* * * * *